United States Patent [19]

Okura

[11] Patent Number: 5,166,561

[45] Date of Patent: Nov. 24, 1992

[54] ACTIVE INTELLIGENT TERMINATION

[75] Inventor: David K. Okura, Nepean, Canada

[73] Assignee: Northern Telecom Limited, Montreal, Canada

[21] Appl. No.: 735,730

[22] Filed: Jul. 25, 1991

[51] Int. Cl.$^5$ .......................... H03K 5/00; H03K 5/01
[52] U.S. Cl. .................................. 307/549; 307/550; 307/268
[58] Field of Search ............. 333/22 R; 307/443, 473, 307/268, 542, 550, 555, 568, 247.1, 549; 328/164

[56] References Cited

U.S. PATENT DOCUMENTS

| | | | |
|---|---|---|---|
| 3,832,575 | 8/1974 | Dasgupta et al. | 307/270 |
| 3,937,988 | 2/1976 | DeClue et al. | 307/549 |
| 3,946,251 | 3/1976 | Kawagoe | 307/550 |
| 4,015,147 | 3/1977 | Davidson et al. | 333/22 R |
| 4,228,369 | 10/1980 | Anantha et al. | 333/22 R |
| 4,345,171 | 8/1982 | Harris, Jr. | 328/171 |
| 4,450,370 | 5/1984 | Davis | 307/475 |
| 4,498,021 | 2/1985 | Uya | 307/443 |
| 4,596,940 | 6/1986 | Schuppan et al. | 307/443 |
| 4,748,426 | 5/1988 | Stewart | 333/22 R |
| 4,761,572 | 8/1988 | Tanizawa | 307/555 |
| 4,766,334 | 8/1988 | Warner | 307/443 |
| 4,859,877 | 8/1989 | Cooperman et al. | 307/443 |

Primary Examiner—Andrew J. James
Assistant Examiner—Sinh Tran
Attorney, Agent, or Firm—F. P. Turpin

[57] ABSTRACT

An active intelligent termination circuit is designed to function as a self-switching clamp adapted to attenuate unwanted signals on a data bus. A field effect transistor is switched on or off in a conducting mode or non-conducting mode respectively in accordance with the data transmitted on the data bus. Any low level unwanted signals which may appear on the bus when data having a voltage level corresponding to a logic zero is present will be attenuated by the field effect transistor which is coupled to both the data bus and to a ground plane. The field effect transistor switches to the non-conducting mode when data corresponding to a logic level one is transmitted on the bus.

4 Claims, 3 Drawing Sheets

ACTIVE INTELLIGENT TERMINATION

FIELD OF THE INVENTION

The invention relates generally to a circuit and method for attenuating unwanted signals on a transmission line.

BACKGROUND OF THE INVENTION

During the transmission of a signal on a transmission line, signal energy is transferred most efficiently when no reflected wave is present. Thus to obtain a transmission of energy with a maximum efficiency, it is necessary to provide means for matching any actual load impedance to the characteristic impedance of the transmission line. However, only under exceptional cases will the load impedance be a resistance that is exactly equal to the characteristic impedance of the line. In many instances a load can be matched to the characteristic impedance of a line by coupling to the load a network of reactances that tunes out the network and load reactance and simultaneously transforms to a value equal to the characteristic impedance of the line; in other instances where the actual load or number of loads on a line may be variable or not precisely known, active termination circuits may be used.

U.S. Pat. No. 4,748,426 issued May 31, 1988 in the name of Alexander Stewart discloses an active termination circuit having a resistor combination permanently connected to a bus that couples a plurality of peripheral devices to one another. Other ends of the resistors are coupled to a positive voltage supply line and to a logic ground plane, respectively. Stewart teaches active impedance matching by on/off control of switches which open or close paths to the resistors.

Computer systems and telecommunication systems often have a plurality of source and destination nodes connected to and sharing a common data transmission facility such as a bus. These nodes may simply be receivers and transceivers located on circuit packs electrically coupled to the bus. Such systems are often designed to be flexible, permitting variable configurations; the capability is therefore provided for an operator to add or remove circuit packs according to the particular requirements. In a system having loads which vary from time to time according to the configuration of circuit packs connected to the bus, it may be difficult to provide adequate terminations to eliminate unwanted signal reflections. In addition, in systems where any particular node may transmit data to one of many possible receiver nodes and the distance between the respective nodes is variable, it is difficult to predict and provide the form of termination that will be required.

In an attempt to overcome some of the aforementioned limitations it is an object of the invention to provide a circuit for attenuating unwanted signals.

The invention provides an active self-switching clamp which is adapted to attenuate unwanted signals having a voltage level which varies from a logic zero level by a small increment.

SUMMARY OF THE INVENTION

In accordance with the invention there is provided a circuit for attenuating unwanted signals on a transmission line adapted to carry data signals comprising: a controllable transmission gate operable in a first mode for conducting unwanted current from the transmission gate to a voltage reference terminal in response to unwanted signals on the transmission line and operable in a second mode for preventing the conduction of current from the transmission line to the terminal, the gate having a first terminal connected to the transmission line a second terminal connected to the voltage reference terminal and a control terminal, and a control circuit means for releasing the transmission gate from conducting in the first mode in response to a clock signal and to the data signals on the transmission line, said control circuit means being coupled to the transmission line via an inverter gate and having its output connected to the control terminal of the controllable transmission gate.

DESCRIPTION OF THE DRAWINGS

The invention will be described in conjunction with the drawings in which:

In FIG. 1 a bus 10 is connected to a plurality of transceivers 13. Each transceiver 13 is coupled to a termination circuit 11. It will be understood that an arbitration scheme may be implemented to prevent bus contention and that a transceiver 13 is capable of broadcasting over the bus 10 to more than 1 transceiver 13.

FIG. 2 shows the bus 10 connected to the termination circuit 11 which includes a resistor 12, an inverter 14, and an n-channel field effect transistor (NFET) 16. The resistor 12 is an off-the-shelf termination resistor having predetermined resistance. Both the NFET 16 and the resistor 12 are coupled to a ground plane having a voltage corresponding to a logic zero value or zero volts. As a form of illustration, a portion of a digital signal having a hi to lo transition is shown having superimposed thereon an unwanted alternating signal. It is desirable to eliminate unwanted signals, caused by reflection, noise, or the like which may not totally be absorbed by conventional termination means such as the termination resistor 12. If the magnitude of any reflected signals becomes too great, transmitted data may become corrupted. For example, if a zero bit is being transmitted, and the unwanted signal reaches a voltage level near the threshold level associated with switching from one logic state to another, the transmitted zero bit may be perceived as a one-bit.

Figure 1:
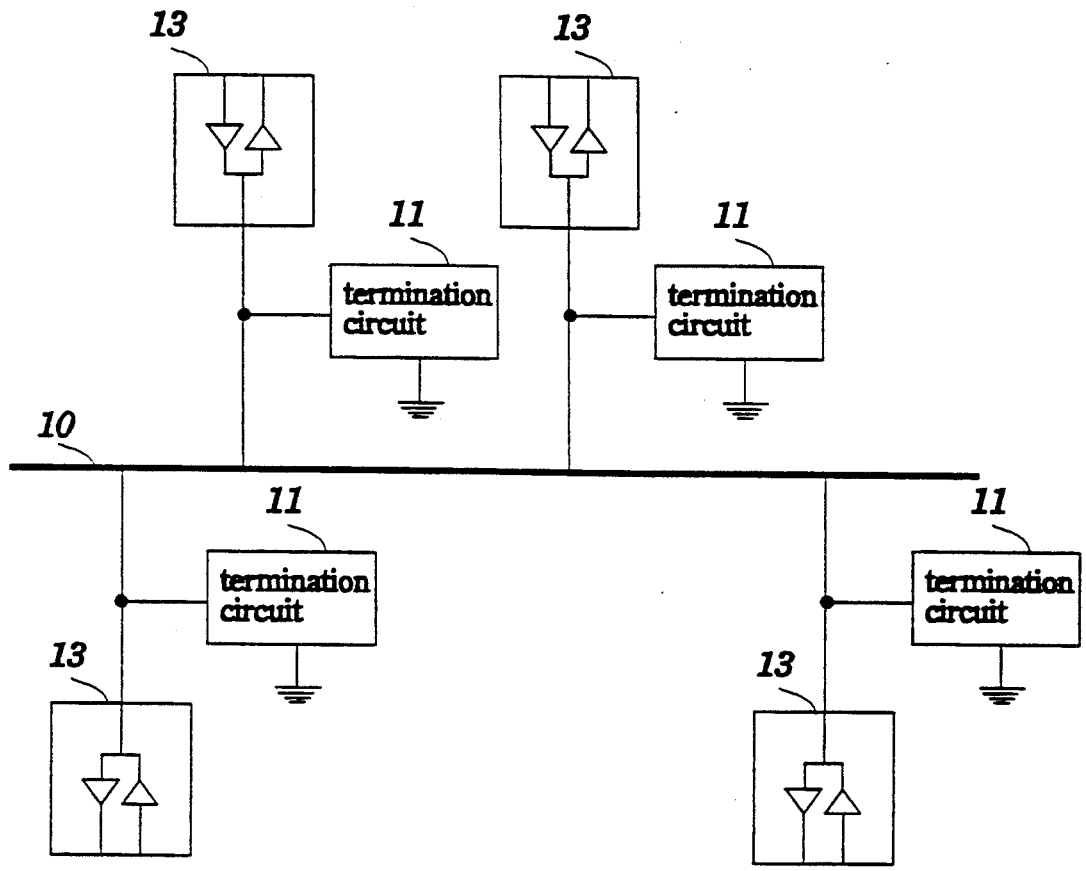
FIG. 1 is a schematic diagram of a bus including a plurality of receivers and transmitters coupled to termination circuits.
Figure 2:
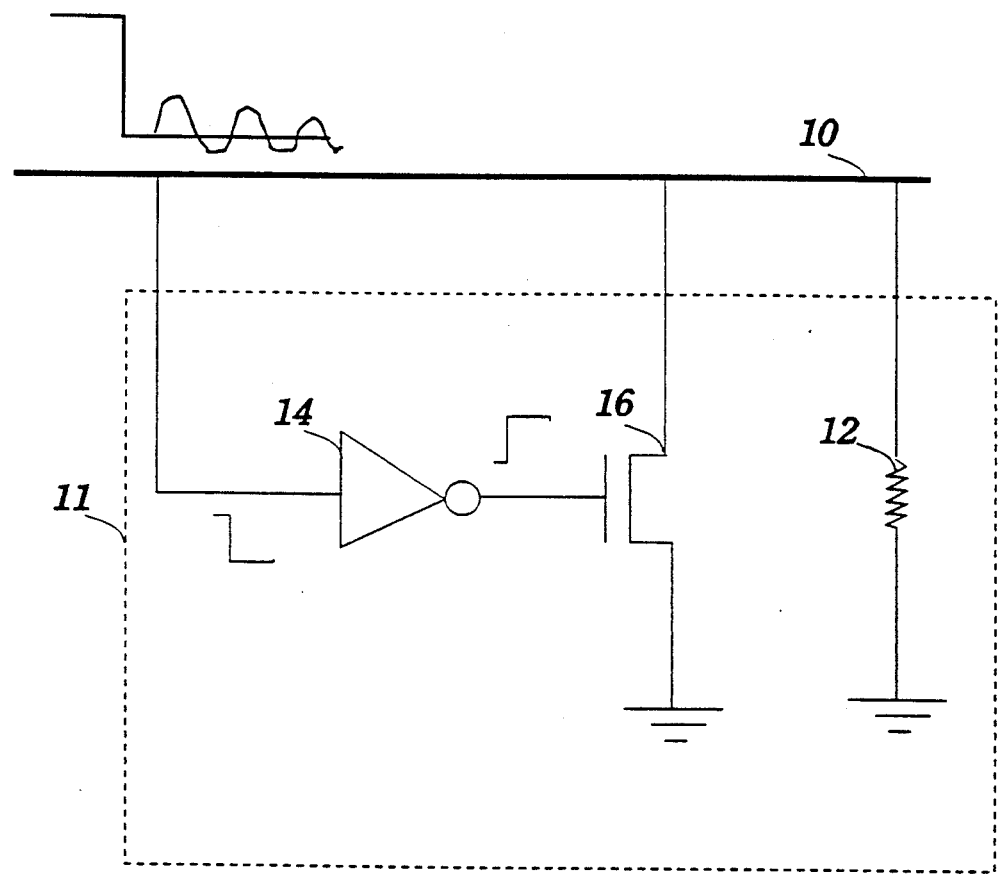
FIG. 2 is circuit diagram of an embodiment of the termination circuit of FIG. 1, having self-switching capability.
Figure 3:
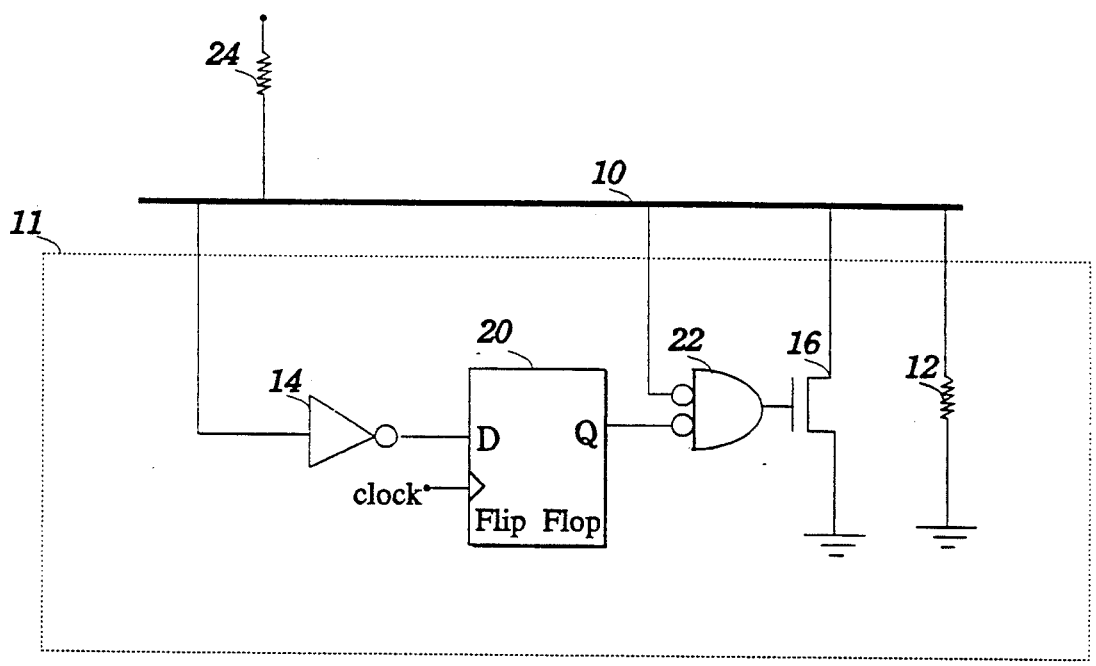
FIG. 3 is a circuit diagram of an alternative embodiment of the invention for use with a tri-stateable bus.

In the preferred embodiment shown in FIG. 3, a flip-flop 20 is coupled to an inverter 14 and to an AND gate 22 having inverted input terminals. An NFET 16 is similarly configured as in FIG. 2 having the source and drain connected to the bus 10 and to a ground plane respectively. The circuit shown in FIG. 3 is suitable for use on a tristatable bus. The flip-flop 20 allows the NFET 16 to switch on and conduct thereby eliminating most of any unwanted signals, and releases the clamp after the data on the bus has been latched. A detailed description of the operation of the circuit will follow.

With reference to FIG. 2, the termination circuit 11 provides a means of self-switching and clamping unwanted spurious reflected signals which otherwise may be perceived as one-bits instead of transmitted zero-bits. The NFET 16 performs the function of clamping when switched on, in a conducting mode. In the instance that a one-bit followed by a zero-bit is transmitted as is illustrated by the waveform in FIG. 2, the zero-bit received at the input terminal of the inverter 14 results in a one-bit at its output terminal. This one-bit corresponding to a digital hi voltage level switches on the gate of the NFET 16 thereby providing a path to ground. In the instance that a one-bit is presented to the input terminal of the inverter 14, a resulting zero-bit corresponding to approximately zero volts switches off the NFET 16 preventing it from conducting and isolating the bus 10 from the ground plane. It should be obvious to a person skilled in the art that the transceivers 13 must be adequately powered to provide enough current to allow the NFET 16 to switch off. More specifically, the transceivers must supply enough current to overpower a switched on conducting NFET to allow the NFET to switch off.

In the preferred embodiment shown in FIG. 3, as data on the bus 10 changes from a one to a zero the NFET 16 switches on and conducts thereby reducing unwanted signals by providing a path to ground. One clock cycle later the zero-bit of data is inverted and is clocked through the flip-flop and the clamp is released, the NFET switching off and not conducting. If the data on the bus 10 changes from a zero to a 1, the clamp remains released and the NFET does not conduct. In the event that the bus becomes tristated, a pull-up resistor 24 provides a voltage corresponding to a logic hi, and the NFET remains switched off and in the non-conducting mode of operation. The flip-flop 20 and the AND gate 22 essentially provide a means of releasing the clamp one clock cycle after the data has been available on the bus 10.

Numerous modifications and variations may be considered without departing from the scope of the invention.

What I claim is:

1. A circuit for attenuating unwanted signals on a transmission line adapted to carry data signals, comprising:
   an inverter gate coupled to the transmission line for providing inverted data signals corresponding to the signals appearing on the transmission line;
   a flip-flop responsive to the inverted data signals and to a local clock signal for providing output signals;
   circuit means connected to the flip-flop for providing inverted output signals thereof;
   an AND gate responsive to the inverted data signals and to the inverted output signals from the flip-flop to provide ANDED signals; and
   a controllable transmission gate connected between the transmission line and terminal connected to a reference voltage, the controllable gate being responsive to the ANDED signals for providing a conducting path to the terminal from the transmission line in a first mode and for preventing conduction between the transmission line and the terminal in a second mode.

2. The circuit as defined in claim 1 wherein the controllable gate is a field effect transistor.

3. A circuit for attenuating unwanted signals on a transmission line adapted to carry data signals, comprising: a controllable transmission gate operable in a first mode for conducting unwanted current from the transmission gate to a voltage reference terminal in response to unwanted signals on the transmission line and operable in a second mode for preventing the conduction of current from the transmission line to the terminal, the gate having a first terminal connected to the transmission line a second terminal connected to the voltage reference terminal and a control terminal, and a control circuit means for releasing the transmission gate from conducting in the first mode in response to a clock signal and to the data signals on the transmission line, said control circuit means being coupled to the transmission line via an inverter gate and having a control circuit output connected to the control terminal of the controllable transmission gate.

4. A circuit as defined in claim 3 wherein the control circuit means comprises,
   a flip-flop responsive to the inverted data signals and to a local clock signal for providing output signals;
   inverting circuit means connected to the flip-flop for providing inverted output signals thereof; and
   an AND gate responsive to the inverted data signals and to the inverted output signals from the flip-flop to provide control signals to the controllable transmission gate.

* * * * *